US011282927B2

United States Patent
Hutchins et al.

(10) Patent No.: US 11,282,927 B2
(45) Date of Patent: Mar. 22, 2022

(54) CONTACT STRUCTURES FOR SEMICONDUCTOR DEVICES

(71) Applicant: Cree, Inc., Durham, NC (US)

(72) Inventors: Edward Lloyd Hutchins, Raleigh, NC (US); Jae-Hyung Park, Apex, NC (US); Edward Robert Van Brunt, Raleigh, NC (US)

(*) Notice: Subject to any disclaimer, the term of this patent is extended or adjusted under 35 U.S.C. 154(b) by 0 days.

(21) Appl. No.: 16/889,981

(22) Filed: Jun. 2, 2020

(65) Prior Publication Data

US 2021/0376158 A1    Dec. 2, 2021

(51) Int. Cl.

| H01L 31/0312 | (2006.01) |
|---|---|
| H01L 29/16 | (2006.01) |
| H01L 29/786 | (2006.01) |
| H01L 29/78 | (2006.01) |
| H01L 29/04 | (2006.01) |
| H01L 29/45 | (2006.01) |
| H01L 23/528 | (2006.01) |
| H01L 21/04 | (2006.01) |

(52) U.S. Cl.
CPC ........ *H01L 29/1608* (2013.01); *H01L 23/528* (2013.01); *H01L 29/045* (2013.01); *H01L 29/45* (2013.01); *H01L 29/7839* (2013.01); *H01L 29/78654* (2013.01); *H01L 21/0485* (2013.01)

(58) Field of Classification Search
CPC ............. H01L 29/78654; H01L 29/045; H01L 29/1608; H01L 29/7839; H01L 29/45; H01L 21/0485; H01L 21/268; H01L 23/528; H01L 23/53209; H01L 23/585; H01L 21/043
See application file for complete search history.

(56) References Cited

U.S. PATENT DOCUMENTS

| 7,875,545 | B2 | 1/2011 | Ward, III et al. |
|---|---|---|---|
| 9,608,166 | B2 | 3/2017 | Slater, Jr. et al. |
| 10,256,097 | B2* | 4/2019 | Joshi ................ H01L 21/0485 |
| 10,665,680 | B2* | 5/2020 | Odekirk ........... H01L 23/53209 |
| 2008/0296771 | A1 | 12/2008 | Das et al. |

\* cited by examiner

*Primary Examiner* — Shouxiang Hu

(74) *Attorney, Agent, or Firm* — Withrow + Terranova, P.L.L.C.

(57) ABSTRACT

Contact structures for semiconductor devices are disclosed. Contact structures that include a metal layer and a substrate of a semiconductor device may be annealed to provide suitable contact resistance. Localized annealed regions may be formed in a pattern within the contact structure to provide a desired contact resistance while reducing exposure of other portions of the semiconductor device to anneal conditions. The annealed regions may be formed in patterns that reduce intersections between annealed regions and fracture planes of the substrate, thereby improving mechanical robustness of the semiconductor device. The patterns may include annealed regions formed in lines that are nonparallel with fracture planes of the substrate. The patterns may also include annealed regions formed in lines that are nonparallel with peripheral edges of the substrate.

36 Claims, 7 Drawing Sheets

CONTACT STRUCTURES FOR SEMICONDUCTOR DEVICES

FIELD OF THE DISCLOSURE

The present disclosure relates to semiconductor devices and more particularly to contact structures for semiconductor devices.

BACKGROUND

Semiconductor devices such as transistors and diodes are ubiquitous in modern electronic devices. Wide bandgap semiconductor material systems such as gallium arsenide (GaAs), gallium nitride (GaN), and silicon carbide (SiC) are being increasingly utilized in semiconductor devices to push the boundaries of device performance in areas such as switching speed, power handling capability, and thermal conductivity. Examples include individual devices such as metal-oxide-semiconductor field-effect transistors (MOSFETs), insulated gate bipolar transistors (IGBTs), Schottky barrier diodes, GaN high electron mobility transistors (HEMTs), and integrated circuits such as monolithic microwave integrated circuits (MMICs) that include one or more individual devices.

During fabrication, multiple semiconductor devices are typically formed across a common substrate before they are singulated into individual devices. The individual devices may then be handled by automated pick and place equipment for placement and mounting onto submounts of packages, modules, and/or integrated circuits. During placement, semiconductor devices can be prone to breaking or cracking due to stresses associated with equipment handling, submount particle contamination, and submount flatness variations, among others. Additionally, reliability testing can introduce thermomechanical stresses that can also cause breaking and/or cracking failures. The likelihood of such failures can increase with larger area semiconductor devices.

The art continues to seek improved semiconductor device structures capable of overcoming challenges associated with conventional semiconductor devices.

SUMMARY

The present disclosure relates to semiconductor devices and more particularly to contact structures for semiconductor devices. Contact structures that include a metal layer and a substrate of a semiconductor device may be annealed to provide suitable contact resistance. Localized annealed regions may be formed in a pattern within the contact to provide a desired contact resistance while reducing exposure of other portions of the semiconductor device to anneal conditions. The annealed regions may be formed in patterns that reduce intersections between annealed regions and fracture planes of the substrate, thereby improving mechanical robustness of the semiconductor device. The patterns may include anneal regions formed in lines that are nonparallel with fracture planes of the substrate. The patterns may also include anneal regions formed in lines that are nonparallel with peripheral edges of the substrate.

In one aspect, a semiconductor device comprises: a substrate comprising a crystal structure that forms a plurality of fracture planes; and a contact on the substrate, the contact comprising a plurality of annealed regions that are arranged along a plurality of lines. Each line of the plurality of lines is formed by annealed regions of the plurality of annealed regions that are sequential next-closest neighbors with one another, and the plurality of lines is nonparallel with the plurality of fracture planes. In certain embodiments, the substrate comprises a silicon carbide (SiC) substrate. In certain embodiments, the fracture planes comprise $\{1\bar{1}00\}$ crystallographic planes of SiC. In certain embodiments, the SiC substrate comprises 4H SiC. In certain embodiments, the contact further comprises a metal layer on the SiC substrate, and the plurality of annealed regions form a silicide of the metal layer. In certain embodiments, the metal layer comprises nickel and the silicide comprises nickel silicide. In certain embodiments, each line of the plurality of lines comprises at least three annealed regions of the plurality of annealed regions. In certain embodiments, each line of the plurality of lines is nonparallel with any peripheral edge of the substrate. Certain lines of the plurality of lines may be parallel and/or nonparallel with other lines of the plurality of lines. In certain embodiments, a spiral pattern is formed by an individual line of the plurality of lines or by the plurality of lines when each line of the plurality of lines is aligned in an end-to-end arrangement. In certain embodiments, annealed regions of an individual line of the plurality of lines are positioned offset from annealed regions of a next adjacent line of the plurality of lines to form a zig-zag pattern.

In certain embodiments, the contact is a backside contact formed on a bottom of the substrate, and the semiconductor device further comprises an active semiconductor region on a top of the substrate and one or more topside contacts on the active semiconductor region. In certain embodiments, the backside contact, the substrate, the active semiconductor region, and the one or more topside contacts form a metal-oxide-semiconductor field-effect transistor (MOSFET). In certain embodiments, the MOSFET comprises a SiC MOSFET.

In certain embodiments, the backside contact, the substrate, the active semiconductor region, and the one or more topside contacts form a Schottky barrier diode. In certain embodiments, the Schottky barrier diode comprises a SiC Schottky barrier diode.

In another aspect, a semiconductor device comprises: a SiC substrate comprising a first side, a second side that opposes the first side, and a plurality of peripheral edges; an active semiconductor region on the first side of the SiC substrate; and a backside contact on the second side of the SiC substrate, the backside contact comprising a plurality of metal silicide regions that are spaced apart along the second side of the substrate. The plurality of metal silicide regions is arranged along a plurality of lines, and each line of the plurality of lines is formed by metal silicide regions of the plurality of metal silicide regions that are sequential next-closest neighbors with one another. The plurality of lines is nonparallel with the plurality of peripheral edges of the substrate.

In certain embodiments, the backside contact comprises nickel and the plurality of metal silicide regions comprises nickel silicide. In certain embodiments, center points of the plurality of metal silicide regions are spaced apart by a spacing in a range from 30 μm to 60 μm. In certain embodiments, each line of the plurality of lines comprises metal silicide regions that are laterally surrounded by one or more metal regions. In certain embodiments, each metal silicide region of the plurality of metal silicide regions comprises a lower concentration region of metal silicide that laterally surrounds a higher concentration region of metal silicide. In certain embodiments, the lower concentration regions of next-closest neighbors of the plurality of metal silicide regions at least partially overlap within the plurality of lines. In certain embodiments, each line of the plurality of lines comprises metal silicide regions that are laterally surrounded by one or more metal regions and metal silicide regions that at least partially overlap with other metal silicide regions. In certain embodiments, the semiconductor device comprises a SiC MOSFET. In certain embodiments, the semiconductor device comprises a SiC Schottky barrier diode. In certain embodiments, one or more of the plurality of metal silicide regions are laterally surrounded by a metal layer.

In another aspect, a semiconductor device comprises: a substrate comprising a crystal structure that forms a plurality of fracture planes; and a contact on the substrate, the contact comprising a plurality of annealed regions that are arranged such that lines formed by next-closest annealed regions of the plurality of annealed regions are parallel with less than a third of the plurality of fracture planes. In certain embodiments, the lines formed by the next-closest annealed regions of the plurality of annealed regions are parallel with less than twenty percent or less than ten percent of the plurality of fracture planes. In certain embodiments, the lines formed by the next-closest annealed regions of the plurality of annealed regions are formed to at least partially extend between two different peripheral edges of the substrate. In further embodiments, the lines are formed to entirely extend between the two different peripheral edges of the substrate. In certain embodiments, the substrate comprises a SiC substrate and the plurality of fracture planes comprise {1 1̄00} crystallographic planes of SiC. In certain embodiments, the contact comprises a metal layer on the SiC substrate, and the plurality of annealed regions form a silicide of the metal layer. In certain embodiments, the metal layer comprises nickel and the silicide comprises nickel silicide. The lines formed by the next-closest annealed regions of the plurality of annealed regions may be nonparallel with any peripheral edge of the substrate.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
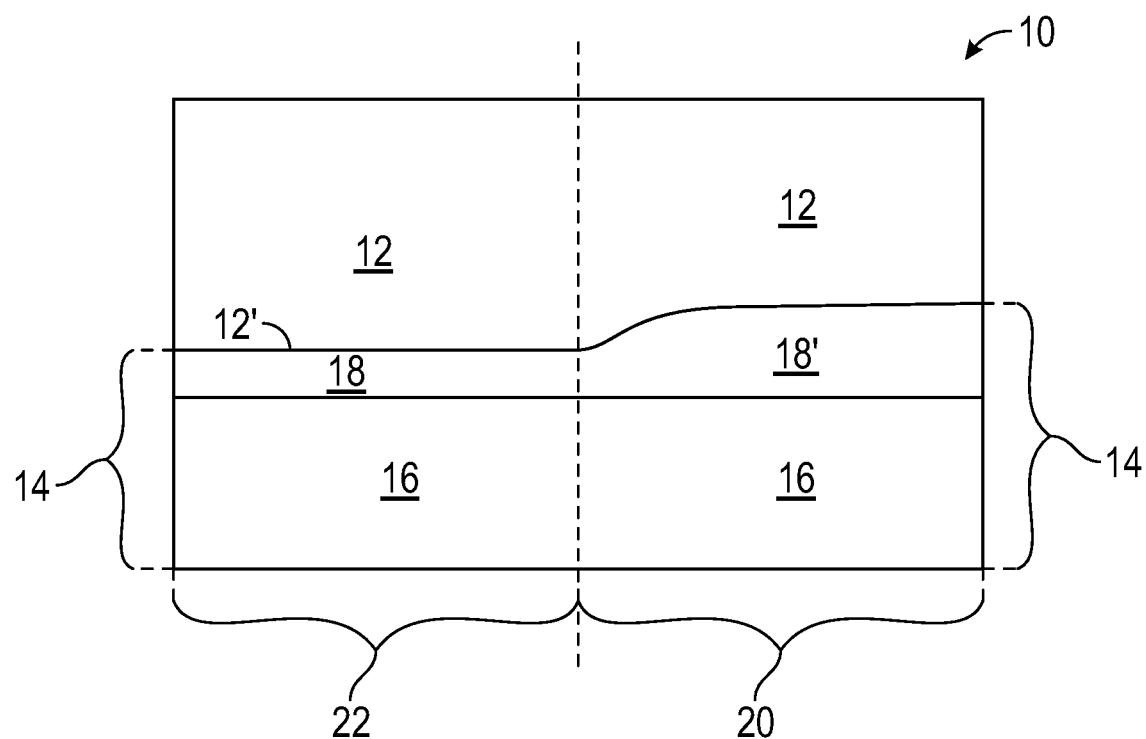
FIG. 1 is a cross-sectional view of a portion of an exemplary semiconductor device that includes a substrate with a backside contact.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to semiconductor devices and more particularly to contact structures for semiconductor devices. Contact structures that include a metal layer and a substrate of a semiconductor device may be annealed to provide suitable contact resistance. Localized annealed regions may be formed in a pattern within the contact structure to provide a desired contact resistance while reducing exposure of other portions of the semiconductor device to anneal conditions. The annealed regions may be formed in patterns that reduce intersections between annealed regions and fracture planes of the substrate, thereby improving mechanical robustness of the semiconductor device. The patterns may include annealed regions formed in lines that are nonparallel with fracture planes of the substrate. The patterns may also include annealed regions formed in lines that are nonparallel with peripheral edges of the substrate.

Embodiments disclosed herein may be applied to substrates or wafers of various crystalline materials, of both single crystal and polycrystalline varieties. In certain embodiments, substrates or wafers may comprise cubic, hexagonal, and other crystal structures, and may comprise crystalline materials having on-axis and off-axis crystallographic orientations. Exemplary embodiments may include single crystal semiconductor materials having hexagonal crystal structure, such as 4H-silicon carbide (SiC) or 6H—SiC, although other substrate materials such as gallium nitride (GaN) may also be used. Various illustrative embodiments described hereinafter mention SiC generally, but it is to be appreciated that other suitable crystalline materials may be used. Among the various SiC polytypes, the 4H—SiC polytype is particularly attractive for power electronic devices due to its high thermal conductivity, wide bandgap, and isotropic electron mobility. Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5 to 10 degrees or a subrange thereof such as 2 to 6 degrees or another subrange). Certain embodiments disclosed herein may utilize on-axis 4H—SiC or vicinal (off-axis) 4H—SiC having an offcut in a range from 1 to 10 degrees, or 2 to 6 degrees, or about 2, 4, 6, or 8 degrees.

Embodiments disclosed herein may also apply to both doped crystalline semiconductor materials (e.g., N-doped conductive SiC and/or P-doped SiC), co-doped, and/or undoped crystalline semiconductor materials (e.g., semi-insulating SiC or high resistivity SiC). In certain embodiments, SiC crystalline materials may comprise N-type doping (including intentional and unintentional dopants such as N) with concentrations in a range from $1 \times 10^{17}$ cm$^{-3}$ to $1 \times 10^{21}$ cm$^{-3}$, or in a range from $1 \times 10^{17}$ cm$^{-3}$ to $3 \times 10^{18}$ cm$^{-3}$, or in a range from $1 \times 10^{18}$ cm$^{-3}$ to $1 \times 10^{19}$ cm$^{-3}$, or in a range from $1 \times 10^{18}$ cm$^{-3}$ to $3 \times 10^{18}$ cm$^{-3}$, or less than $1 \times 10^{17}$ cm$^{-3}$ among others. In certain embodiments, N-doped SiC crystalline materials may have a resistivity in a range from 0.001 ohm-cm to 0.05 ohm-cm, or in a range from 0.001 ohm-cm to 0.03 ohm-cm, or in a range from 0.005 ohm-cm to 0.05 ohm-cm, or in a range from 0.005 ohm-cm to 0.03 ohm-cm. In other embodiments, higher resistivity SiC crystalline materials, including semi-insulating SiC boules and semi-insulating SiC wafers, may comprise unintentionally doped or undoped SiC with a resistivity of at least 1500 ohm-cm, or at least 5000 ohm-cm, or at least 50,000 ohm-cm, or at least $1 \times 10^5$ ohm-cm, or at least $1 \times 10^6$ ohm-cm, or at least $1 \times 10^9$ ohm-cm or in a range from 1500 ohm-cm to $1 \times 10^9$ ohm-cm, or in a range from $1 \times 10^5$ ohm-cm to $1 \times 10^9$ ohm-cm. Semi-insulating SiC wafers may be doped with vanadium (V), aluminum (Al), or combinations thereof. Co-doped SiC wafers may comprise combinations of two or more dopants, such as nitrogen (N), Al, and V, among others depending on the embodiment.

As is described in more detail below, aspects disclosed herein may provide contact structures for various semiconductor devices, including discrete devices such as metal-oxide-semiconductor field-effect transistors (MOSFETs), insulated gate bipolar transistors (IGBTs), Schottky barrier diodes, P—N diodes, PIN diodes, high electron mobility transistors (HEMTs), and integrated devices such as monolithic microwave integrated circuits (MMICs), modules, or other integrated circuits that incorporate discrete semiconductor devices. Particular embodiments may be well suited for wide bandgap semiconductor devices that include SiC substrates, and more particularly for vertical semiconductor devices that include SiC substrates. As such, particular embodiments are applicable to SiC MOSFETs comprising SiC substrates, SiC Schottky barrier diodes comprising SiC substrates, and gallium nitride (GaN) HEMTs comprising SiC substrates. Generally, a vertical structure includes electrical contacts that are arranged on opposing topside and bottom side surfaces of devices. As used herein, a topside contact may also be referred to as a front side contact and a bottom side contact may also be referred to as a backside contact. By way of example, a vertical MOSFET structure that includes a SiC substrate may include a source contact and a gate contact on a top surface of MOSFET device layers and a drain contact that is formed on a back surface of the SiC substrate. Since SiC is a preferred substrate for vertical semiconductor devices, backside electrical contacts to SiC substrates with low electrical resistance are utilized.

Generally, the interface between a contact and a semiconductor material, including semiconductor substrates, should have a sufficiently low electrical resistance to allow flow of current easily in both directions between the contact and the semiconductor material. A contact resistance between the contact and the semiconductor material can be measured according to a current-voltage (I-V) curve. It is desirable for a contact resistance at a contact-to-semiconductor material interface to demonstrate a linear or near linear I-V curve that is indicative of a low voltage drop at the interface. As used herein, an "ohmic" contact generally refers to a contact-to-semiconductor interface that exhibits a linear I-V curve. In this regard, an ohmic contact may refer to a contact where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies). In certain embodiments, an ohmic contact may be characterized as a contact with a specific contact resistivity of less than about $10\ e^{-03}$ ohm-cm$^2$ and, in some embodiments less than about $10\ e^{-04}$ ohm-cm$^2$.

Suitable contact resistance between backside electrical contacts and a SiC substrate may be provided in a number of manners. In one example, ion implantation may be performed on a backside of a SiC substrate to introduce dopants having a same conductivity as that of the SiC substrate, thereby increasing electrical conductance between the SiC substrate and contact metals. Annealing may follow to activate the implanted dopants and accordingly increase the effective carrier concentration at the backside of the SiC substrate. In another example, a silicidation process can be applied to the backside of a SiC substrate to form a metal silicide layer or interface that provides increased electrical conductance. In this manner, a metal layer that is formed on the backside of a SiC substrate may be annealed to form the metal silicide. Thermal annealing may provide a continuous metal silicide at the backside while laser annealing may be employed to selectively form regions of metal silicide.

FIG. 1 is a cross-sectional view of portion of an exemplary semiconductor device 10 that includes a substrate 12 with a backside contact 14. The substrate 12 may comprise SiC and the backside contact 14 may form a structure that comprises a metal layer 18 that is arranged on a bottom surface 12' of the substrate 12 and one or more additional metal layers 16 that are arranged on the metal layer 18 opposite the substrate 12. As described above, an annealing process may be employed to increase electrical conductance between the backside contact 14 and the substrate 12. In FIG. 1, a vertical dashed line is superimposed on the semiconductor device 10 to illustrate an annealed region 20 of the backside contact 14 and an unannealed region 22 of the backside contact 14. During annealing, the metal layer 18 is heated at a temperature at which a metal-silicon compound, or metal silicide 18', will form. In certain embodiments, the metal layer 18 comprises nickel and as such, the metal silicide 18' comprises nickel silicide. As used herein, the term "metal silicide" is used in a broad sense to identify any compound or composition formed of a particular metal and silicon. For example, the metal layer 18 may comprises nickel or alloys thereof to form nickel silicide and the term nickel silicide may identify any compound or composition that includes nickel and silicon, including but not limited to NiSi, Ni$_2$Si, and NiSi$_2$, among others. In other embodiments, the metal layer 18 may comprise other metals that form a metal silicide with SiC, such as chromium and alloys thereof to form chromium silicide. In a similar manner, chromium silicide may identify any compound or composition that includes chromium and silicon, including but not limited to CrSi, CrSi$_2$, and Cr$_3$Si, among others. In various embodiments, the metal layer 18 may include one or more of nickel, chromium, palladium, platinum, titanium, tungsten, tantalum, molybdenum, cobalt, zirconium, and alloys thereof that may form a corresponding metal silicide with SiC. The metal layer 18 is arranged between the substrate 12 and the one or more additional metal layers 16, thereby reducing metal silicide formation in the one or more additional metal layers 16. In certain embodiments, the one or more additional metal layers 16 may include one or more combinations of the same metal layers listed above for the metal layer 18 as well as solder materials such as gold, tin, and alloys thereof.

The annealing process may comprise subjecting the entire backside contact 14 to thermal anneal or selectively annealing localized portions of the backside contact 14. In FIG. 1, a selective annealing process, such as laser annealing may be used to form the annealed region 20 in a localized manner adjacent to the unannealed region 22. Laser annealing may be performed by scanning a laser beam across the backside contact 14. In certain embodiments, laser annealing comprises applying a pulsed laser beam across the backside contact 14 to form an array, grid, or pattern of the annealed regions 20. As will be described below in greater detail, annealed regions 20 may appear as dots or rounded regions at the interface between the backside contact 14 and the substrate 12 and may be visible with the aid of a microscope through transparent or semi-transparent regions of the semiconductor device 10. Such laser annealing may be beneficial to provide suitable contact resistance, including forming an ohmic contact, while avoiding the need for exposing high temperature thermal annealing to the other portions of the semiconductor device 10. Laser annealing of an ohmic contact for silicon carbide is described in U.S. Pat. No. 9,608,166 to Slater, Jr. et al., entitled "Localized Annealing of Metal-Silicon Carbide Ohmic Contacts and Devices So Formed," the disclosure of which is hereby incorporated herein by reference in its entirety as if set forth fully herein. As illustrated in FIG. 1, the compound between the metal of the metal layer 18 and the substrate 12 forms the metal silicide 18' with a thickness that is greater than a thickness of the metal layer 18 in the unannealed region 22.

Figure 2:
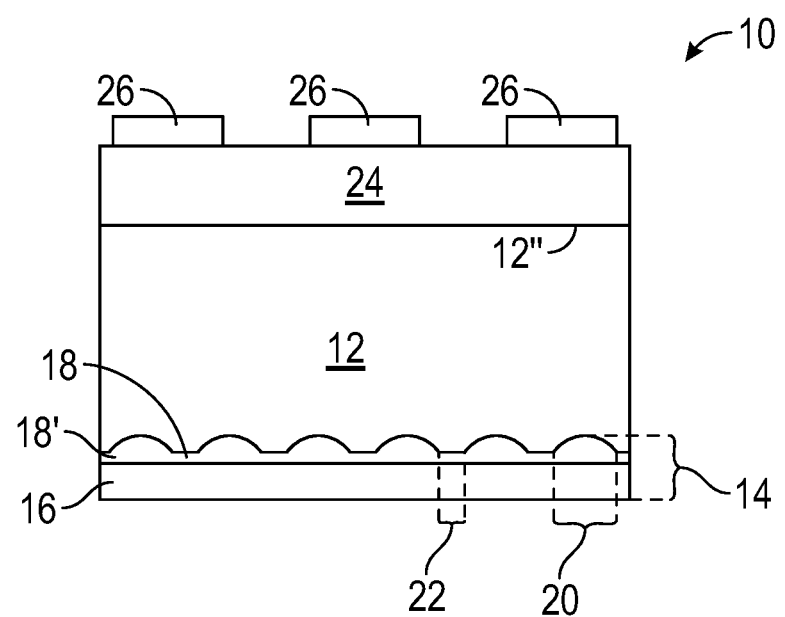
FIG. 2 is a cross cross-sectional view of the exemplary semiconductor device that further illustrates an active semiconductor region on a top surface of the substrate.

FIG. 2 is a cross cross-sectional view of the exemplary semiconductor device 10 that further illustrates an active semiconductor region 24 on a top surface or side 12" of the substrate 12. The semiconductor device 10 additionally includes the metal layer 18 and the one or more additional metal layers 16 that are provided on the bottom surface or side 12' of the substrate 12 to form the backside contact 14. In FIG. 2, a laser annealing process has been applied to the backside contact 14 to form a plurality of annealed regions 20 that are spaced from one another by unannealed regions 22. In this regard, the metal layer 18 forms localized regions of the metal silicide 18' that are registered with the annealed regions 20. One or more topside contacts 26 are provided on the active semiconductor region 24. In various embodiments, the active semiconductor region 24 together with the substrate 12, the one or more topside contacts 26 and the backside contact 14 may form a vertical semiconductor device that may comprise a MOSFET, an IGBT, a Schottky barrier diode, a P—N diode, a PIN diode, or a HEMT among other discrete semiconductor devices. Depending on the device, the active semiconductor region 24 may comprise epitaxial semiconductor layers, implanted regions, insulating layers, etched regions, and other device elements. By way of example, for a MOSFET, the one or more topside contacts 26 may comprise respective source and gate contacts and the backside contact 14 may comprise a drain contact. For a Schottky barrier diode, the one or more topside contacts 26 may comprise a Schottky contact.

Figure 3A:
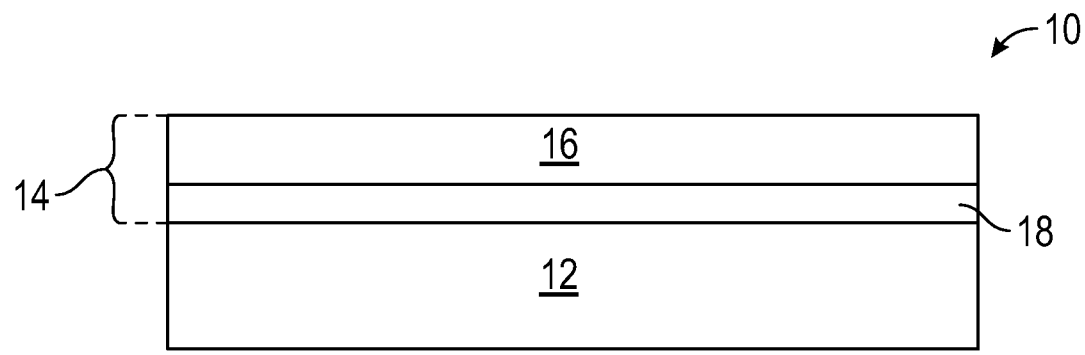
FIG. 3A is a cross-sectional view of a portion of the exemplary semiconductor device before annealing of the backside contact.
Figure 3B:
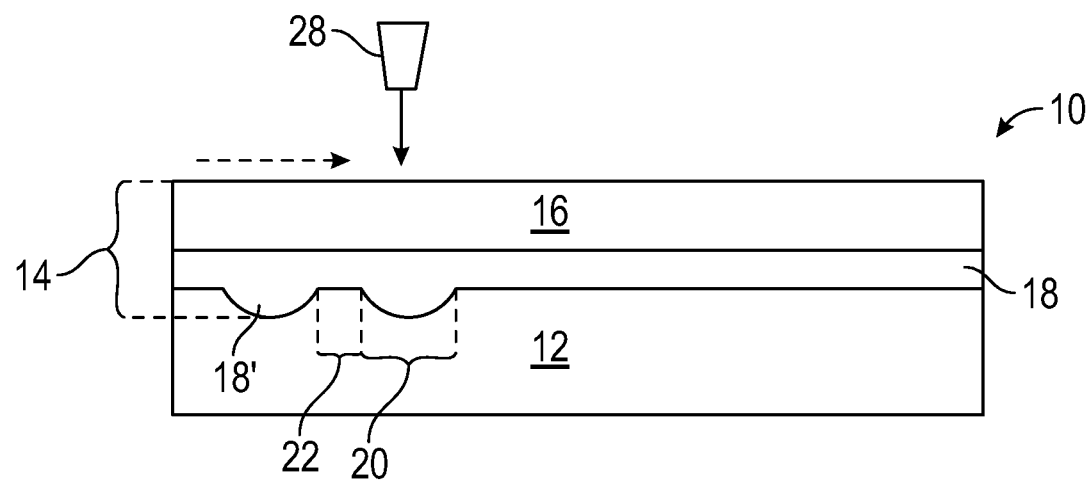
FIG. 3B is a cross-sectional view of the portion of the exemplary semiconductor device of FIG. 3A during localized laser annealing.

FIG. 3A is a cross-sectional view of a portion of the exemplary semiconductor device 10 before annealing of the backside contact 14. FIG. 3B is a cross-sectional view of the portion of the exemplary semiconductor device 10 of FIG. 3A during localized laser annealing. In both of FIGS. 3A and 3B, the cross-sectional views are inverted from FIGS. 1 and 2 to illustrate how laser annealing may be applied. In FIG. 3B, a laser head 28 is shown that may be moved across the backside contact 14 and substrate 12 in a direction as indicated by the horizontal dashed arrow. At a particular interval, the laser head 28 may apply laser emissions that are focused to promote formation of the metal silicide 18', thereby forming the plurality of annealed regions 20 that are separated by the unannealed regions 22.

Figure 3C:
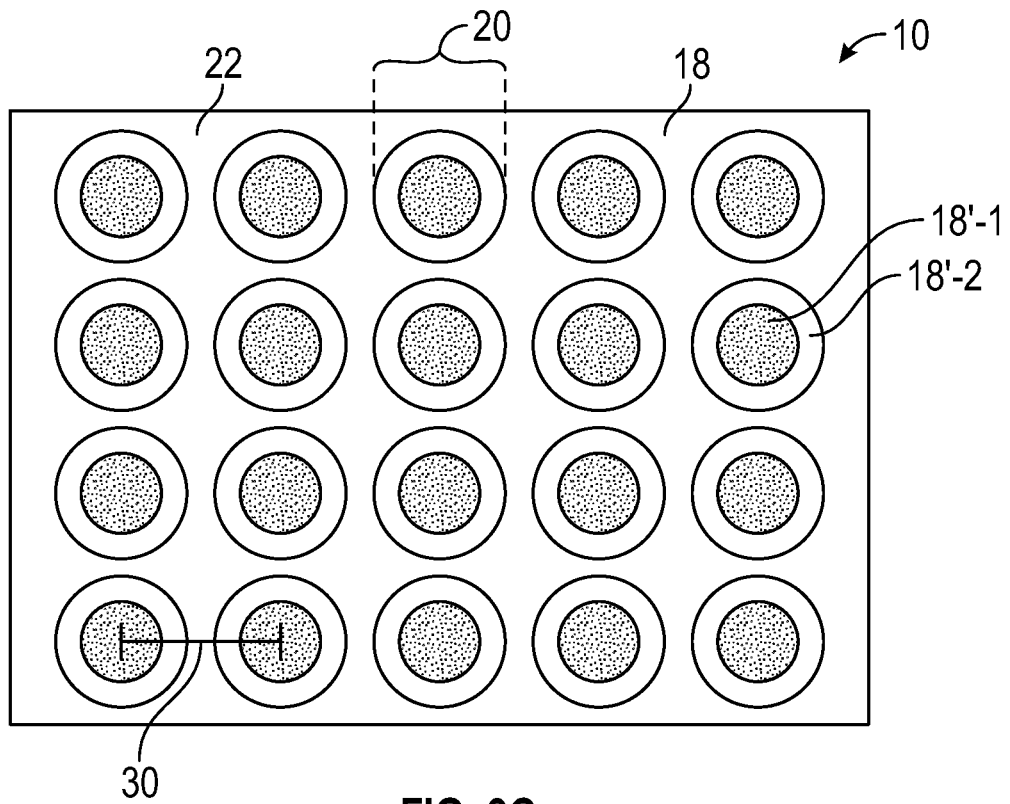
FIG. 3C is a top view of the semiconductor device illustrating an example where annealed regions form in a localized manner such that all next-closest neighbors are separated or laterally surrounded by unannealed regions.
Figure 3D:
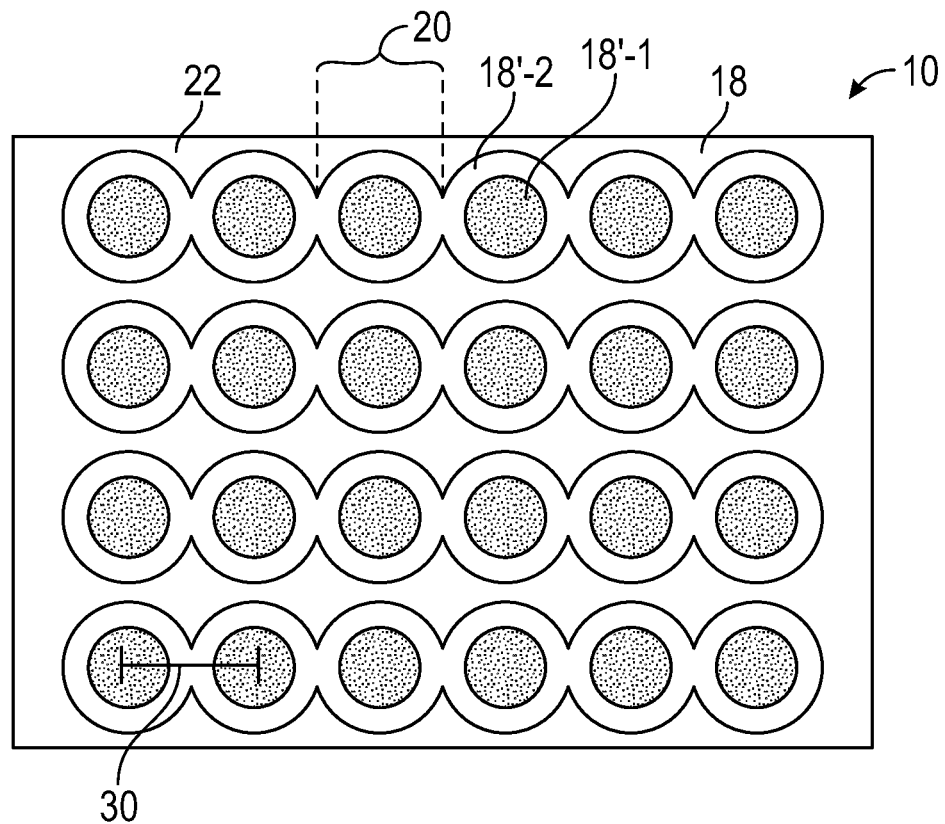
FIG. 3D is a top view of the semiconductor device illustrating an example where annealed regions at least partially overlap or intersect with next-closest neighbors of the annealed regions.

FIGS. 3C and 3D are top views of the semiconductor device 10 illustrating examples of the plurality of annealed regions 20 that may be formed after laser annealing. From the top view, the annealed regions 20 may appear as contrasting darker regions compared with the unannealed regions 22. As illustrated, the plurality of annealed regions 20 may be formed with a spacing 30 between center points of sequential next-closest neighbors of the annealed regions 20. In this regard, the spacing 30 may be formed by a pitch of applied laser emissions that forms an array of the annealed regions 20. In order to provide suitably low contact resistance, including formation of an ohmic contact, the annealed regions 20 may not be spaced too far apart. In certain embodiments, the spacing comprises a distance of 60 microns (μm) or less, or 50 μm or less, or 35 μm or less, or in a range from 30 μm to 60 μm, or in a range from 35 μm to 55 μm, or in a range from 10 μm to 60 μm, or in a range from 20 μm to 40 μm. In still further embodiments, the spacing may comprise a distance that is greater than 60 μm. Depending on the laser power and the time applied, each annealed region 20 may form variable concentrations or amounts of metal silicide regions 18'-1, 18'-2.

Typically, higher concentration regions of metal silicide 18'-1 are registered with a center of each annealed region 20 that corresponds to a center point of applied laser emissions. Lower concentration regions of metal silicide regions 18'-2 may form radially around the higher concentration regions 18'-1. Since the higher concentration regions of metal silicide 18'-1 experience higher amounts of laser energy, increased amounts of laser damage may also be associated with the higher concentration regions of metal silicide 18'-1. In this regard, the spacing 30 may be provided such that the increased damage regions associated with the higher concentration regions of metal silicide 18'-1 are spaced apart, but not so far apart to negatively impact electrical conductance. In certain embodiments, the higher concentration regions of metal silicide 18'-1 may grade toward the lower concentration regions of metal silicide 18'-2. As illustrated in FIG. 3C, the plurality of annealed regions 20 may form in a localized manner such that all next-closest neighbors of the annealed regions 20 are separated or laterally surrounded by unannealed regions 22. FIG. 3D illustrates an embodiment where the lower concentration regions of metal silicide 18'-2 may at least partially overlap or intersect with next-closest neighbors of the annealed regions 20. This may form by decreasing the laser pitch such that the spacing 30 between center points of the annealed regions 20 is reduced. The overlap may also be formed by increasing laser energy that is applied to form each of the annealed regions 20. While some overlap of the lower concentration regions of metal silicide 18'-2 may occur, the higher concentration regions of metal silicide 18'-1 associated with increased laser damage may still be spaced apart from one another. In certain embodiments, the plurality of annealed regions 20 may form in a combination of the embodiments illustrated in FIG. 3C and FIG. 3D such that some annealed regions 20 are surrounded by unannealed regions with other annealed regions 20 having some overlap.

Figure 4:
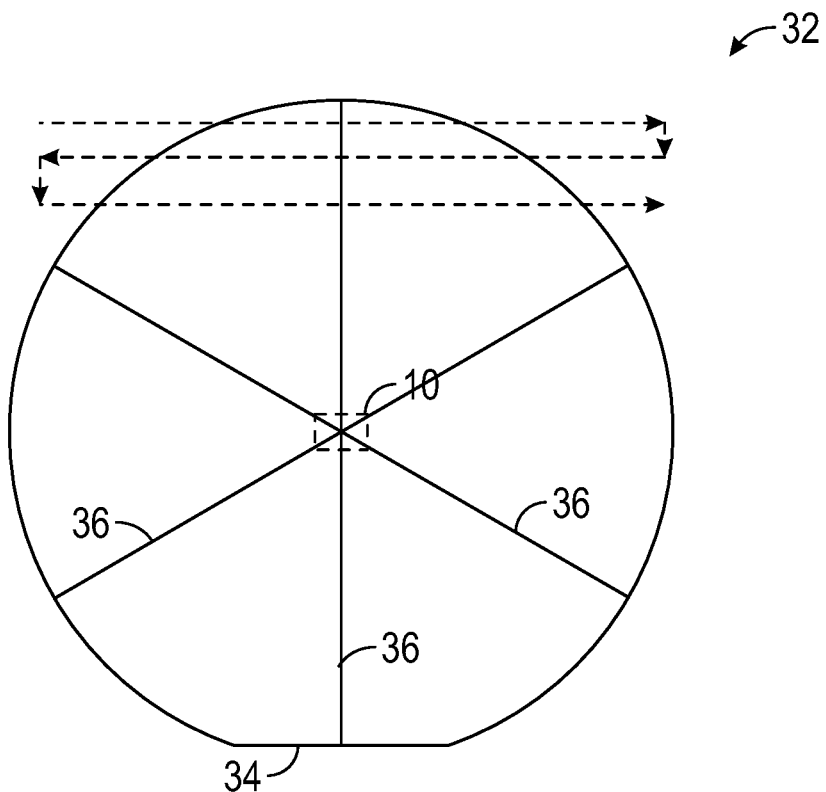
FIG. 4 is a top view of a wafer that includes a plurality of semiconductor devices formed thereon before the semiconductor devices are singulated and superimposed lines are shown on the wafer to indicate fracture planes.

FIG. 4 is a top view of a wafer 32 that includes a plurality of semiconductor devices 10 formed thereon before singulation. As used herein, the term "wafer" is used to describe the substrate 12 of FIG. 2 before singulation of individual devices 10. In certain embodiments, the terms "substrate" and "wafer" may be used interchangeably as a wafer is typically used as a substrate for multiple semiconductor devices that may be formed thereon. For illustrative purposes, a representative location of one semiconductor device 10 is indicated by a superimposed dashed box. As illustrated, the semiconductor device 10 is typically formed with opposing peripheral edges that are either parallel or perpendicular with a major flat 34 of the wafer 32. In a typical laser annealing process, a laser source is traversed across the wafer 32 and along a path indicated by the superimposed horizontal dashed lines. As illustrated, the path may begin at a top of the wafer 32 and progress toward the major flat 34 of the wafer 32 in a series of the horizontal lines that may alternate from left-to-right and right-to-left. Due to the crystallographic structure of the wafer 32, a plurality of preferred cleavage or fracture planes 36 exist. The fracture planes 36 are defined crystallographic planes for a particular crystalline material where a split or break is most likely to occur. For example, (0001) 4H and 6H SiC have a preferred set of fracture planes 36 along $\{1\bar{1}00\}$ crystallographic planes. The $\{1\bar{1}00\}$ family of crystallographic planes may be annotated as all permutations of $\{1\bar{1}00\}$ where the c-axis is set at 0, including the planes $(10\bar{1}0)$, $(1\bar{1}00)$, $(01\bar{1}0)$, $(0\bar{1}10)$, $(\bar{1}100)$, and $(\bar{1}010)$. By way of example, the wafer 32 may comprise a (0001) 4H SiC wafer where the [11$\bar{2}$0] crystallographic direction is perpendicular to the major flat 34. In this manner, at least one of the fracture planes 36 is perpendicular with the major flat 34, while others of the fracture planes 36 are along oblique angles with respect to the major flat 34. For illustrative purposes, the fracture planes 36 of FIG. 4 are illustrated as a pattern of three intersecting lines; however, the fracture planes 36 exist with the same pattern throughout the crystallographic material. In this regard, each of the three lines of fracture planes 36 illustrated in FIG. 4 represent a plurality of parallel lines that are present across the entire wafer 32. While the above-described example is provided where the wafer 32 comprises a (0001) 4H SiC wafer where the [11$\bar{2}$0] crystallographic direction is perpendicular to the major flat 34, the principles of embodiments disclosed herein are equally applicable to other crystallographic wafer orientations and corresponding fracture planes, including different configurations of the major flat 34 and off-axis or off-cut wafers where the c-axis is not perpendicular to a surface plane of the wafer 32.

Figure 5:
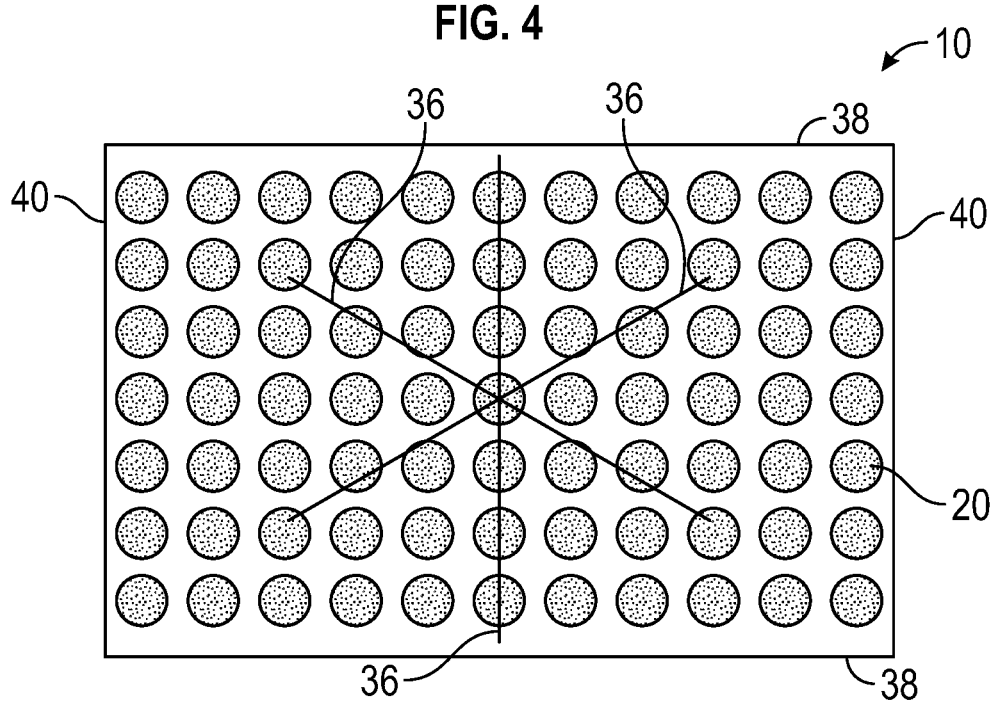
FIG. 5 is a top view of a representative semiconductor device after singulation and further illustrating an arrangement of annealed regions relative to the fracture planes.

FIG. 5 is a top view of the semiconductor device 10 after singulation. The semiconductor device 10 includes opposing peripheral edges 38 that are parallel with the major flat (34 of FIG. 4) and opposing peripheral edges 40 that are perpendicular with the major flat (34 of FIG. 4). The fracture planes 36 of FIG. 4 are also superimposed on the semiconductor device 10. As illustrated in FIG. 5, a typical laser annealing process as described in FIG. 4 can form the annealed regions 20 along a pattern that includes rows and columns of the annealed regions 20. At least one of the columns of annealed regions 20 may form along one of the fracture planes 36. In this manner, portions of the semiconductor device 10 that may have higher amounts of damage associated with increased laser energy are accordingly aligned in a row that is parallel with one of the fracture planes 36. In the top view of FIG. 5, all columns of annealed regions 20 are arranged along fracture planes 36 that are parallel to the peripheral edges 40. As previously described, semiconductor devices can be prone to breaking or cracking due to stresses associated with equipment handling, submount particle contamination, submount flatness variations, and during reliability testing. Having annealed regions 20 that are aligned along weaker fracture planes 36 of the crystalline material (e.g., the substrate 12 of FIG. 2) may cause increased instances of such device breaking and/or cracking.

Figure 6:
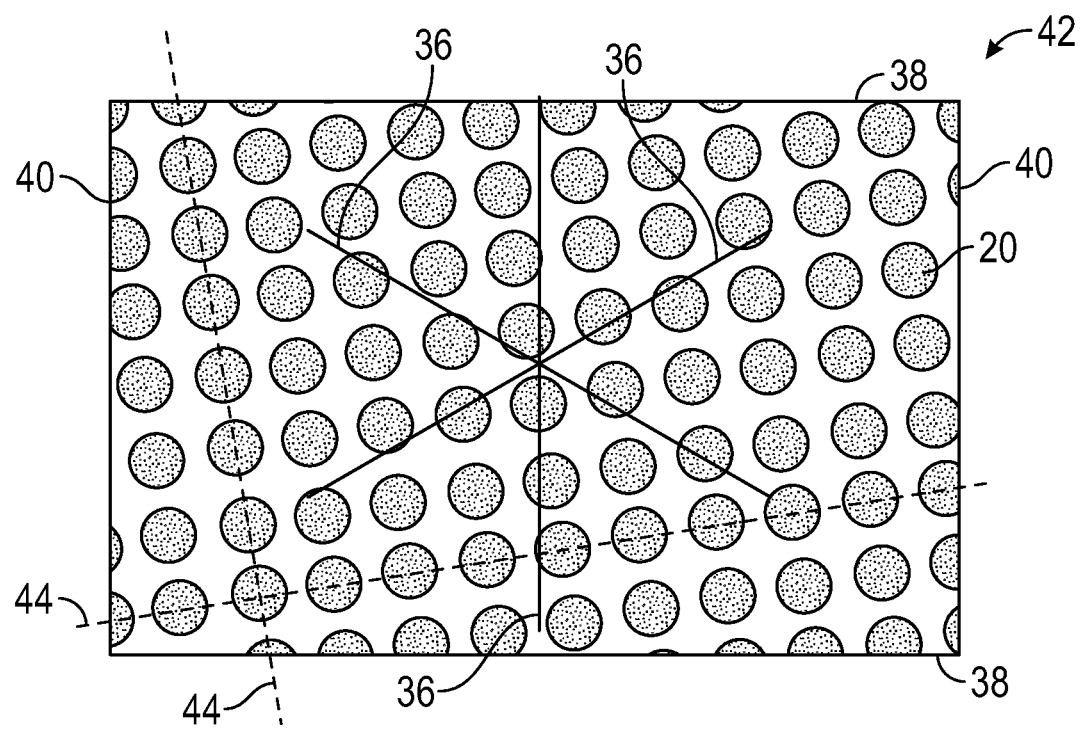
FIG. 6 is a top view of a semiconductor device that is similar to the semiconductor device of FIG. 5, but where the annealed regions are arranged in a pattern that reduces intersections between annealed regions and the fracture planes.

FIG. 6 is a top view of a semiconductor device 42 that is similar to the semiconductor device 10 of FIG. 5, but where the plurality of annealed regions 20 are arranged in a pattern that reduces intersections between annealed regions 20 and the fracture planes 36. In this regard, during annealing, a laser source may be traversed in a manner that is nonparallel to the major flat 34 of FIG. 4 and any of the preferred fracture planes 36. In FIG. 6, the plurality of annealed regions 20 form angled columns and rows that are nonparallel with any of the peripheral edges 38, 40 of the semiconductor device 42. While some annealed regions 20 may intersect with the fracture planes 36, the amount of next-closest neighbors of annealed regions 20 that intersect a particular fracture plane 36 is reduced. In this regard, laser-damaged regions associated with the annealed regions 20 may be more evenly distributed across the semiconductor device 42, and reduced degradation of a fracture strength of the semiconductor device 42 may be realized. Notably, the pattern of the annealed regions 20 in FIG. 6 may comprise a similar laser pattern as the annealed regions 20 of FIG. 5, with the improved fracture strength provided by rotating the pattern with regard to peripheral edges 38, 40 of the substrate and/or the major flat (34 of FIG. 4).

In certain embodiments, the annealed regions 20 of FIG. 6 may be formed with no overlap as illustrated in FIG. 3C. In other embodiments, the annealed regions 20 may be formed with some overlap of the lower concentration regions of metal silicide (18'-2 of FIG. 3C) as illustrated in FIG. 3D. In such embodiments, the higher concentration regions of metal silicide (18'-1 of FIG. 3C) that are associated with increased laser damage may still be arranged to reduce intersections with the fracture planes 36. In further embodiments, the annealed regions 20 may be formed with a combination of the embodiments illustrated in FIG. 3C and FIG. 3D. In certain embodiments, the annealed regions 20 are provided in a pattern that forms a plurality of lines 44 and each line 44 is formed by a linear path through next-closest neighbors of the annealed regions 20. By angling the pattern relative to the peripheral edges 38, 40, the plurality of lines 44 are nonparallel with the plurality of fracture planes 36. In FIG. 6, two of such lines 44 are represented by dashed lines. As illustrated, each of the lines 44 may be formed by a series of at least three or more sequentially aligned annealed regions 20, where each annealed region 20 in a particular line 44 is a next-closest or nearest neighbor with another annealed region 20 of the same line 44. Certain lines 44 of the plurality of lines 44 may be parallel and/or nonparallel with other lines 44 of the plurality of lines 44. In certain embodiments, the lines 44 may be formed that entirely extend between two different peripheral edges 38, 40 of the substrate. In other embodiments, the lines 44 may be formed that partially extend between two different peripheral edges 38, 40 of the substrate.

Turning back to FIG. 5, lines of next-closest neighbors of the annealed regions 20 of the semiconductor device 10 are formed parallel with at least a third of the fracture planes 36. In particular, the columns of annealed regions 20 in FIG. 5 are parallel with the fracture planes 36 that are parallel with the peripheral edges 40. In contrast, the lines 44 of next-closest neighbors of annealed regions 20 for the semiconductor device 42 of FIG. 6 are arranged parallel with less than a third of the fracture planes 36. In further embodiments, the lines 44 of next-closest neighbors may be parallel with less than twenty percent, or less than 10 percent, or less than all of the fracture planes 36.

Figure 7:
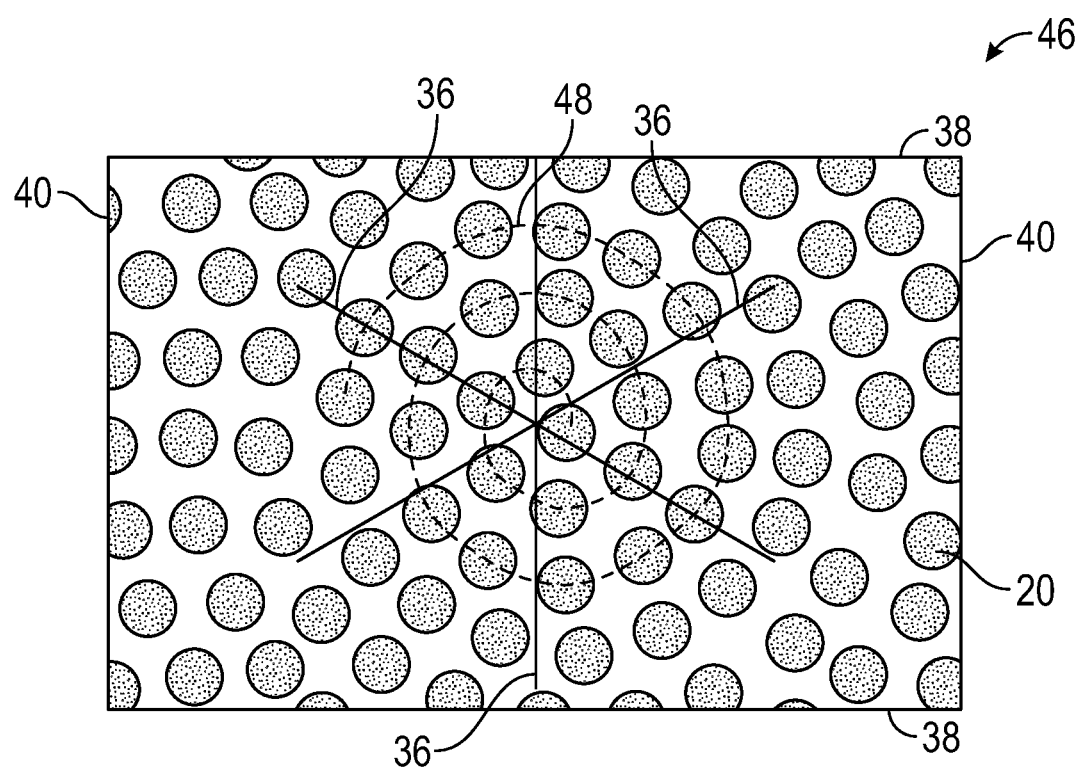
FIG. 7 is a top view of a semiconductor device that is similar to the semiconductor device of FIG. 6, but where the annealed regions are formed in a spiral pattern to reduce intersections between annealed regions and the fracture planes.

FIG. 7 is a top view of a semiconductor device 46 that is similar to the semiconductor device 42 of FIG. 6, but where the plurality of annealed regions 20 are formed in a nonlinear to reduce intersections between the annealed regions 20 and the fracture planes 36. As illustrated by the connected curved-dashed lines 48 of next-closest neighbors, the annealed regions 20 may form a nonlinear or spiral pattern that reduces the amount of next-closest neighbors of annealed regions 20 being formed along the same fracture plane 36. In this regard, during annealing, a laser source may be traversed in a manner that is nonparallel to the major flat 34 of FIG. 4 and any of the preferred fracture planes 36 in the spiral pattern. In certain embodiments, the spiral pattern may be formed continuously across the entire wafer 32 of FIG. 4, or multiple spiral patterns may be formed across different portions of the wafer 32 of FIG. 4. As such, the connected curved-dashed lines 48 may represent an individual line of next-closest annealed regions or multiple lines of next-closest annealed regions that are aligned in an end-to-end arrangement. In this regard, laser-damaged regions associated with the annealed regions 20 may be more evenly distributed across the semiconductor device 46, and reduced degradation of a fracture strength of the semiconductor device 46 may be realized.

Figure 8:
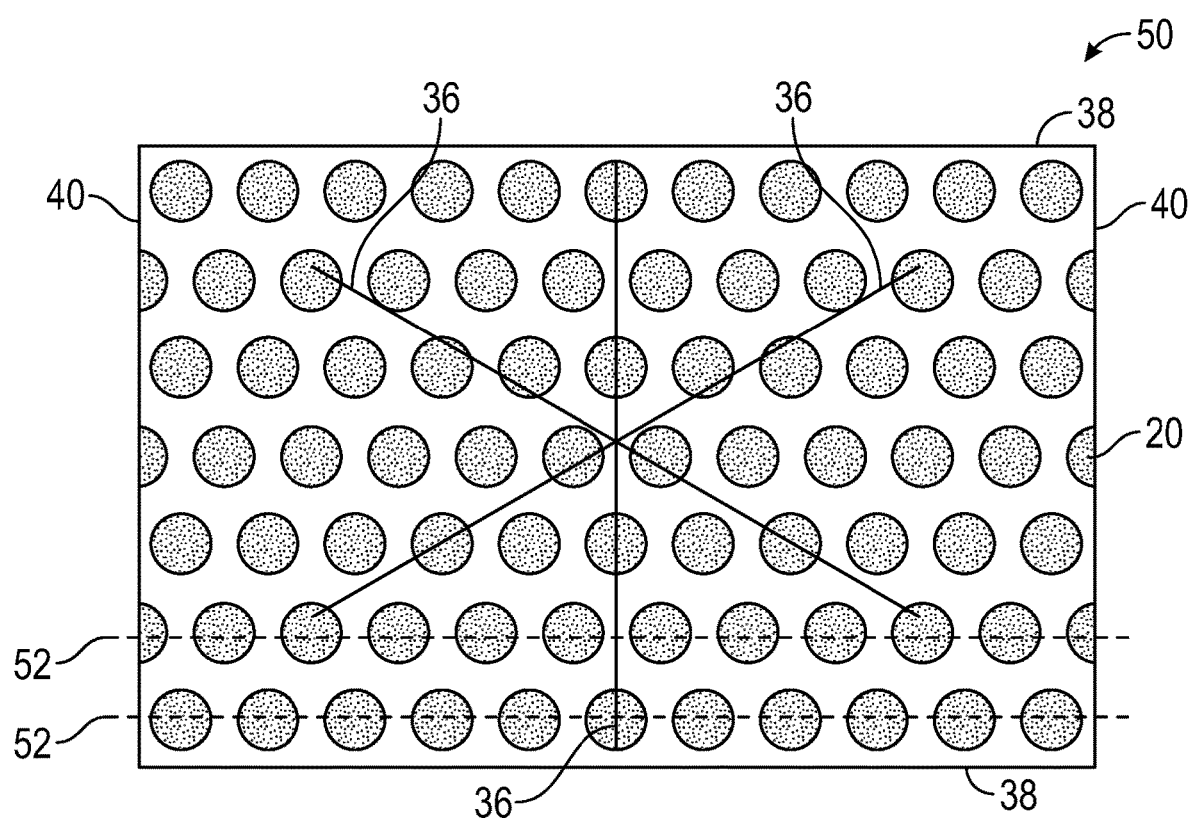
FIG. 8 is a top view of a semiconductor device that is similar to the semiconductor device of FIG. 6 and includes an alternative arrangement of annealed regions in a pattern that reduces intersections between annealed regions and the fracture planes.

FIG. 8 is a top view of a semiconductor device 50 that is similar to the semiconductor device 42 of FIG. 6 and includes an alternative arrangement of the annealed regions 20 in a pattern that reduces intersections between annealed regions 20 and the fracture planes 36. In FIG. 8, the annealed regions 20 are provided in a plurality of lines 52, and each line 52 is formed by a linear path through next-closest neighbors of the annealed regions 20. As illustrated, annealed regions 20 in different or next-adjacent lines 52 may be staggered or offset from one another in a vertical and/or horizontal manner, thereby forming a zig-zag pattern or a checkerboard pattern of the annealed regions 20 relative to at least one of the peripheral edges 38, 40. Notably, the pattern of annealed regions 20 of FIG. 8 may be provided by laser paths that traverse in a parallel manner with the peripheral edges 38, while still reducing interactions of next-closest neighbors of annealed regions 20 with fracture planes 36. As with other embodiments, this may form laser-damaged regions associated with the annealed regions 20 to be more evenly distributed across the semiconductor device 50, thereby reducing degradation of fracture strength.

While the above-described embodiments illustrate various embodiments of annealed region patterns including those that are nonparallel with fracture planes and/or peripheral edges of substrates, spiral patterns, and columns or rows that are arranged in zig-zag or checkerboard patterns, other arrangements are possible without deviating from the embodiments disclosed herein. In certain embodiments, the annealed regions may be formed in a plurality of non-repeating patterns across a semiconductor device that reduce intersections between annealed regions and fracture planes. In other embodiments, the annealed regions may be randomly formed such that intersections between annealed regions and fracture planes are reduced.

As described herein, annealed regions formed to reduce intersections with crystallographic fracture planes may be visible in fully formed and singulated devices. With observation under a stereoscope or an optical microscope, patterns of annealed regions may be clearly distinguishable. For example, such patterns may be visible in microscope images with a 20× magnification lens when focused on the annealed surface of the backside contact through the substrate. In particular, the annealed regions may be more visible through top surfaces of devices in regions that are transparent or semi-transparent, such as regions that are outside of topside contacts.

Figure 9:
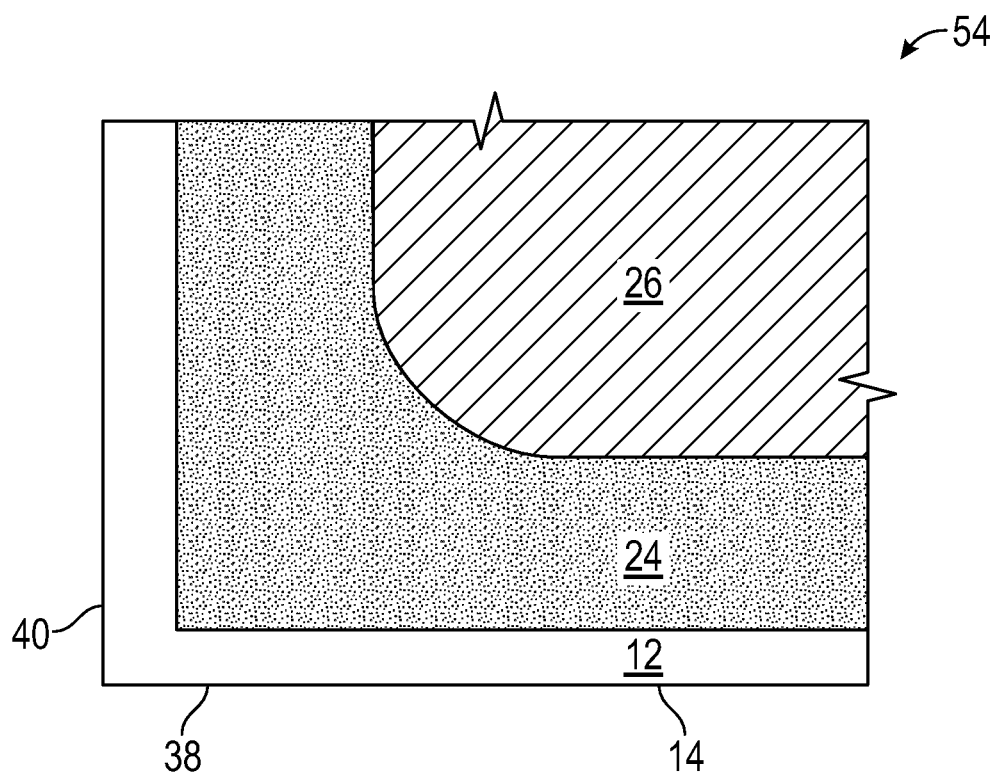
FIG. 9 is a top view illustration of a corner of a representative semiconductor device where certain portions of the semiconductor device are visible outside of a topside contact.

FIG. 9 is a top view illustration of a corner of a semiconductor device 54 where certain portions of the semiconductor device 54 are visible outside of the topside contact 26. In certain arrangements, the active semiconductor region 24 may form a mesa on the substrate 12 such that the active semiconductor region 24 does not extend completely to the peripheral edges 38, 40 of the substrate 12. The active semiconductor region 24 and the substrate 12 may be transparent or semi-transparent such that the interface between the backside contact 14 and the substrate 12 may be visible with a stereoscope or an optical microscope. The backside contact 14 of the semiconductor device 54 was annealed in a manner such that localized annealed regions are not formed. For example, the entire backside contact 14 may be thermally annealed at a sufficient temperature or a laser annealing process may have been performed with a small enough pitch that localized annealed regions are not formed.

Figure 10:
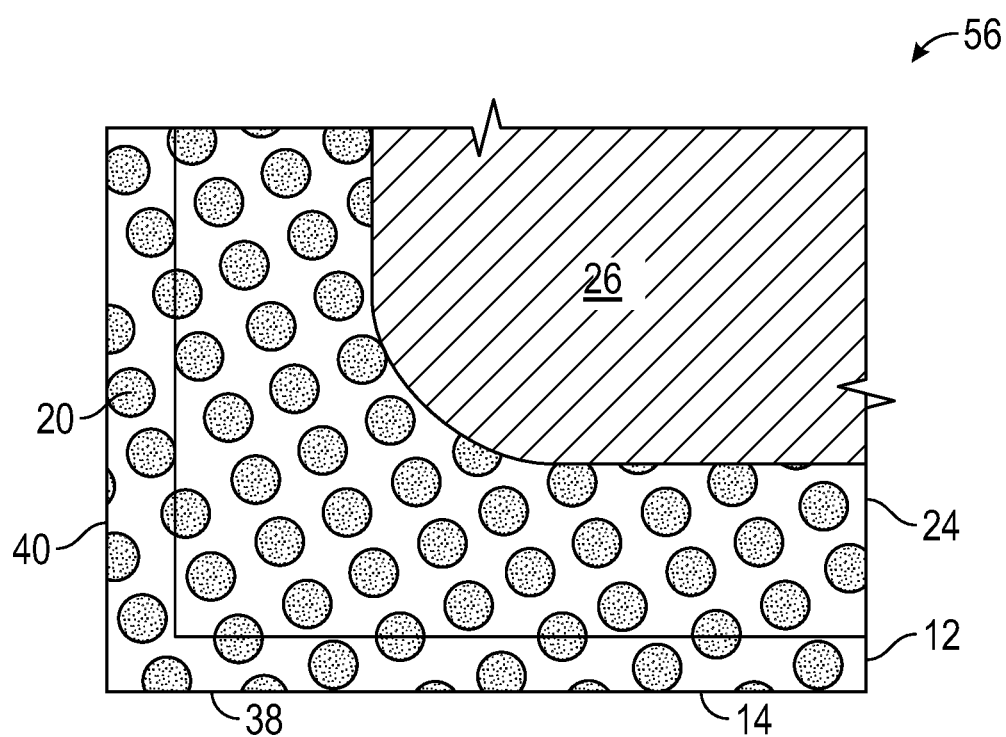
FIG. 10 is a top view illustration of a corner of a semiconductor device where the backside contact has been annealed according to embodiments disclosed herein.

In contrast, FIG. 10 is a top view illustration of a corner of a semiconductor device 56 where the backside contact 14 has been annealed according to embodiments disclosed herein. In particular, the semiconductor device 56 represents a laser annealing process that was performed according to the semiconductor device 42 of FIG. 6. In some applications, portions of the semiconductor device 56 that are between the backside contact 14 and the top contact 26 may be transparent or semitransparent. In this regard, portions of the backside contact 14 that are outside of the top contact 26 may be visible from a top view of the semiconductor device 56, particularly with the aid of a microscope. As illustrated, the annealed regions 20 are visible outside of the topside contact 26 and form a pattern of angled columns or lines that are nonparallel with any of the peripheral edges 38, 40 of the semiconductor device 56 and any crystallographic fracture planes of the substrate 12. As previously described, at least one of the peripheral edges 38, 40 are typically aligned with the major flat (34 of FIG. 4) of a crystalline wafer from which the semiconductor device 56 was formed. As such, at least one of the peripheral edges 38, 40 may also be parallel with a fracture plane of the substrate 12 and a simple visual microscopic inspection of the semiconductor device 56 may be all that is needed to identify the pattern of annealed regions 20. As disclosed herein, the backside contact 14 may provide suitable contact resistance with the substrate 12, including formation of an ohmic contact, while also reducing intersections of annealed regions 20 and fracture planes of the substrate 12, thereby improving a fracture strength and mechanical robustness of the semiconductor device 56.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a substrate comprising a crystal structure that forms a plurality of fracture planes; and
   a contact on the substrate, the contact comprising a plurality of annealed regions that are arranged along a plurality of lines, each line of the plurality of lines being formed by annealed regions of the plurality of annealed regions that are sequential next-closest neighbors with one another, the plurality of lines being nonparallel with the plurality of fracture planes.

2. The semiconductor device of claim 1, wherein the substrate comprises a silicon carbide (SiC) substrate.

3. The semiconductor device of claim 2, wherein the fracture planes comprise {1$\bar{1}$00} crystallographic planes of SiC.

4. The semiconductor device of claim 2, where the SiC substrate comprises 4H SiC.

5. The semiconductor device of claim 2, wherein the contact further comprises a metal layer on the SiC substrate, and the plurality of annealed regions form a silicide of the metal layer.

6. The semiconductor device of claim 5, wherein the metal layer comprises nickel and the silicide comprises nickel silicide.

7. The semiconductor device of claim 1, wherein each line of the plurality of lines comprises at least three annealed regions of the plurality of annealed regions.

8. The semiconductor device of claim 1, wherein each line of the plurality of lines is nonparallel with any peripheral edge of the substrate.

9. The semiconductor device of claim 1, wherein certain lines of the plurality of lines are parallel with other lines of the plurality of lines.

10. The semiconductor device of claim 1, wherein certain lines of the plurality of lines are nonparallel with other lines of the plurality of lines.

11. The semiconductor device of claim 1, wherein a spiral pattern is formed by an individual line of the plurality of lines or by the plurality of lines when each line of the plurality of lines is aligned in an end-to-end arrangement.

12. The semiconductor device of claim 1, wherein annealed regions of an individual line of the plurality of lines are positioned offset from annealed regions of a next adjacent line of the plurality of lines to form a zig-zag pattern.

13. The semiconductor device of claim 1, wherein the contact is a backside contact formed on a bottom of the substrate, and the semiconductor device further comprises an active semiconductor region on a top of the substrate and one or more topside contacts on the active semiconductor region.

14. The semiconductor device of claim 13, wherein the backside contact, the substrate, the active semiconductor region, and the one or more topside contacts form a metal-oxide-semiconductor field-effect transistor (MOSFET).

15. The semiconductor device of claim 14, wherein the MOSFET comprises a silicon carbide (SiC) MOSFET.

16. The semiconductor device of claim 15, wherein the backside contact, the substrate, the active semiconductor region, and the one or more topside contacts form a Schottky barrier diode.

17. The semiconductor device of claim 16, wherein the Schottky barrier diode comprises a SiC Schottky barrier diode.

18. A semiconductor device comprising:
    a silicon carbide (SiC) substrate comprising a first side, a second side that opposes the first side, and a plurality of peripheral edges;
    an active semiconductor region on the first side of the SiC substrate; and
    a backside contact on second side of the SiC substrate, the backside contact comprising a plurality of metal silicide regions that are spaced apart along the second side of the substrate, the plurality of metal silicide regions arranged along a plurality of lines, each line of the plurality of lines being formed by metal silicide regions of the plurality of metal silicide regions that are sequential next-closest neighbors with one another, the plurality of lines being nonparallel with the plurality of peripheral edges of the substrate.

19. The semiconductor device of claim 18, wherein the backside contact comprises nickel and the plurality of metal silicide regions comprises nickel silicide.

20. The semiconductor device of claim 18, wherein center points of the plurality of metal silicide regions are spaced apart by a spacing in a range from 30 μm to 60 μm.

21. The semiconductor device of claim 18, wherein each line of the plurality of lines comprises metal silicide regions that are laterally surrounded by one or more metal regions.

22. The semiconductor device of claim 18, wherein each metal silicide region of the plurality of metal silicide regions comprises a lower concentration region of metal silicide that laterally surrounds a higher concentration region of metal silicide.

23. The semiconductor device of claim 22, wherein the lower concentration regions of next-closest neighbors of the plurality of metal silicide regions at least partially overlap within the plurality of lines.

24. The semiconductor device of claim 18, wherein each line of the plurality of lines comprises metal silicide regions that are laterally surrounded by one or more metal regions and metal silicide regions that at least partially overlap with other metal silicide regions.

25. The semiconductor device of claim 18, wherein the semiconductor device comprises a SiC metal-oxide-semiconductor field-effect transistor (MOSFET).

26. The semiconductor device of claim 18, wherein the semiconductor device comprises a SiC Schottky barrier diode.

27. The semiconductor device of claim 18, wherein one or more of the plurality of metal silicide regions are laterally surrounded by a metal layer.

28. A semiconductor device comprising:
    a substrate comprising a crystal structure that forms a plurality of fracture planes; and
    a contact on the substrate, the contact comprising a plurality of annealed regions that are arranged such that lines formed by next-closest annealed regions of the plurality of annealed regions are parallel with less than a third of the plurality of fracture planes.

29. The semiconductor device of claim 28, wherein the lines formed by the next-closest annealed regions of the plurality of annealed regions are parallel with less than twenty percent of the plurality of fracture planes.

30. The semiconductor device of claim 28, wherein the lines formed by the next-closest annealed regions of the plurality of annealed regions are parallel with less than ten percent of the plurality of fracture planes.

31. The semiconductor device of claim 28, wherein the lines formed by the next-closest annealed regions of the plurality of annealed regions are formed to at least partially extend between two different peripheral edges of the substrate.

32. The semiconductor device of claim 31, wherein the lines are formed to entirely extend between the two different peripheral edges of the substrate.

33. The semiconductor device of claim 28, wherein the substrate comprises a silicon carbide (SiC) substrate and the plurality of fracture planes comprise $\{1\bar{1}00\}$ crystallographic planes of SiC.

34. The semiconductor device of claim 33, wherein the contact comprises a metal layer on the SiC substrate, and the plurality of annealed regions form a silicide of the metal layer.

35. The semiconductor device of claim 34, wherein the metal layer comprises nickel and the silicide comprises nickel silicide.

36. The semiconductor device of claim 28, wherein the lines formed by the next-closest annealed regions of the plurality of annealed regions are nonparallel with any peripheral edge of the substrate.

* * * * *

UNITED STATES PATENT AND TRADEMARK OFFICE
CERTIFICATE OF CORRECTION

PATENT NO. : 11,282,927 B2
APPLICATION NO. : 16/889981
DATED : March 22, 2022
INVENTOR(S) : Hutchins et al.

It is certified that error appears in the above-identified patent and that said Letters Patent is hereby corrected as shown below:

On the Title Page

Add:
--(73) Assignee: Wolfspeed, Inc., Durham, NC (US)--

Signed and Sealed this
Fifth Day of September, 2023

Katherine Kelly Vidal
*Director of the United States Patent and Trademark Office*